(12) United States Patent
Katti

(10) Patent No.: US 7,053,430 B2
(45) Date of Patent: May 30, 2006

(54) ANTIFERROMAGNETIC STABILIZED STORAGE LAYERS IN GMRAM STORAGE DEVICES

(75) Inventor: Romney R. Katti, Maple Grove, MN (US)

(73) Assignee: Honeywell International Inc., Morristown, NJ (US)

(*) Notice: Subject to any disclaimer, the term of this patent is extended or adjusted under 35 U.S.C. 154(b) by 185 days.

(21) Appl. No.: 10/706,068

(22) Filed: Nov. 12, 2003

(65) Prior Publication Data

US 2005/0098809 A1     May 12, 2005

(51) Int. Cl.
*H01L 31/119* (2006.01)

(52) U.S. Cl. .............................. 257/295; 257/E43.004; 365/171

(58) Field of Classification Search .................. 257/295
See application file for complete search history.

(56) References Cited

U.S. PATENT DOCUMENTS

| | | | |
|---|---|---|---|
| 6,469,873 B1* | 10/2002 | Maruyama et al. | 360/314 |
| 6,714,444 B1* | 3/2004 | Huai et al. | 365/171 |
| 6,744,086 B1* | 6/2004 | Daughton et al. | 257/295 |
| 2003/0184918 A1* | 10/2003 | Lin et al. | 360/314 |

FOREIGN PATENT DOCUMENTS

EP     1 033 764 A2     9/2000

\* cited by examiner

*Primary Examiner*—David Nelms
*Assistant Examiner*—Dao H. Nguyen
(74) *Attorney, Agent, or Firm*—Schiff Hardin LLP

(57) ABSTRACT

A giant magnetoresistive memory device includes a magnetic sense layer, a magnetic storage layer, a non-magnetic spacer layer between the magnetic sense layer and the magnetic storage layer, and an antiferromagnetic layer formed in proximity to the magnetic storage layer. The antiferromagnetic layer couples magnetically in a controlled manner to the magnetic storage layer such that the magnetic storage layer has uniform and/or directional magnetization. Additionally or alternatively, an antiferromagnetic layer may be formed in proximity to the magnetic sense layer. The antiferromagnetic layer in proximity to the magnetic sense layer couples magnetically in a controlled manner to the magnetic sense layer such that the magnetic sense layer has uniform and/or directional magnetization.

27 Claims, 2 Drawing Sheets

ANTIFERROMAGNETIC STABILIZED STORAGE LAYERS IN GMRAM STORAGE DEVICES

The Government has rights in this invention pursuant to Contract No. DTRA01-00-C-002 awarded by the Defense Threat Reduction Agency.

TECHNICAL FIELD OF THE INVENTION

The present invention relates to a memory device that utilizes magnetoresistance.

BACKGROUND OF THE INVENTION

A magnetoresistive (MR) device is a device whose resistance changes in accordance with a change in magnetization. Almost every conducting magnetic material exhibits some magnetoresistance. However, the magnetoresistive effect is particularly large in certain materials such as permalloys, which are nickel-iron (NiFe) alloys, and other ferromagnetic materials such as Co, Ni, and Fe alloys. Magnetoresistive devices respond to magnetic fields, and provide signals that typically are significantly more than that achieved with Hall sensors. A class of magnetoresistive devices with a larger sensitivity than standard magnetoresistive devices is known as giant magnetoresistive (GMR) devices. A random access memory that uses magnetoresistive films is generally referred to as a magnetoresistive random access memory (MRAM).

In an MRAM, a triple-layer structure having two ferromagnetic layer structures separated by a thin non-magnetic layer therebetween form a basic memory device. One of the ferromagnetic layer structures is used to store (write) information and the other of the ferromagnetic layer structures is used to sense (read) the stored information.

Typically, giant magnetoresistive devices are realized by choosing the thicknesses of the ferromagnetic thin-films and the intermediate layers in "sandwich" structures. Such devices, with the giant magnetoresistive effect, yield a magnetoresistive response that can be at least an order of magnitude greater than that associated with anisotropic magnetoresistive devices.

The magnetization of the ferromagnetic layers in giant magnetoresistive memories can be intended to be uniform. However, under certain conditions, the magnetization can become non-uniform. This non-uniformity can reduce the repeatability of the switching that occurs during writing of information to the giant magnetoresistive device which, in turn, reduces the reliability of the giant magnetoresistive memory.

The present invention is directed to an arrangement for increasing the uniformity of the magnetization of the ferromagnetic layers in giant magnetoresistive memories.

SUMMARY OF THE INVENTION

In accordance with one aspect of the present invention, a giant magnetoresistive memory device comprises a magnetic storage layer, a magnetic sense layer, a non-magnetic spacer layer between the magnetic sense layer and the magnetic storage layer, and an antiferromagnetic layer formed in proximity to the magnetic storage layer. The antiferromagnetic layer couples magnetically in a controlled manner to the magnetic storage layer such that the magnetic storage layer has uniform and/or directional magnetization.

In accordance with another aspect of the present invention, a giant magnetoresistive memory device comprises a magnetic storage layer, a magnetic sense layer, a non-magnetic spacer layer between the magnetic sense layer and the magnetic storage layer, and first and second antiferromagnetic layers. The first antiferromagnetic layer is formed in proximity to the magnetic storage layer whereby the first antiferromagnetic layer couples magnetically in a controlled manner to the magnetic storage layer such that the magnetic storage layer has uniform and/or directional magnetization. The second antiferromagnetic layer is formed in proximity to the magnetic sense layer whereby the second antiferromagnetic layer couples magnetically in a controlled manner to the magnetic sense layer such that the magnetic sense layer has uniform and/or directional magnetization.

In accordance with still another aspect of the present invention, a method of fabricating a giant magnetoresistive memory device comprises the following: forming a non-magnetic spacer layer between a magnetic sense layer and a magnetic storage layer; and, forming an antiferromagnetic layer in proximity to one of the magnetic storage layer and the magnetic sense layer whereby the antiferromagnetic layer couples magnetically in a controlled manner to the one of the magnetic storage layer and the magnetic sense layer such that the one of the magnetic storage layer and the magnetic sense layer has uniform and/or directional magnetization.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
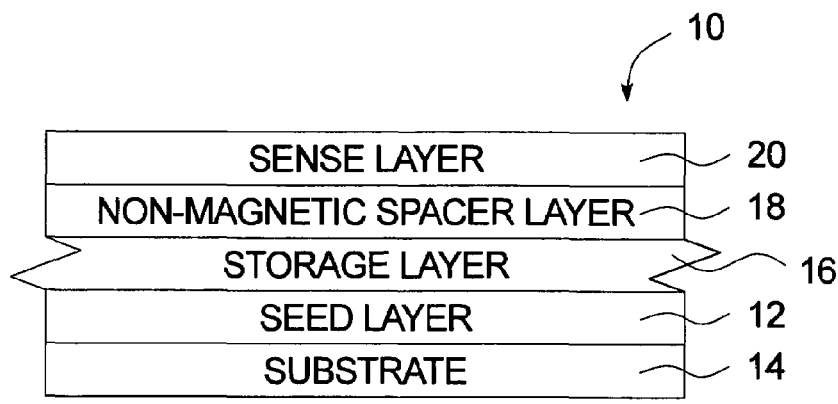
FIG. 1 illustrates the layers of a conventional multilayer stack used for giant magnetoresistive memories.

As shown in FIG. 1, a giant magnetoresistive memory device 10 includes a seed layer 12 which may be formed, such as by sputter deposition of silicon nitride or tantalum, on a substrate 14. The substrate 14 may be silicon. The seed layer 12 is optional.

A storage layer 16 is formed over the seed layer 12. The storage layer 16, for example, may be a ferromagnetic alloy or multilayer such as NiFeCo, NiFe/CoFe, NiFe, or CoFe that is sputter deposited over the seed layer 12. The material, thickness, and layer structure is chosen to optimize switching and magnetoresistive properties for writing and for reading. The storage layer 16 is used to store data stored in the giant magnetoresistive memory device 10. Typically, the storage layer 16 has a thickness of between 1 nm and 10 nm.

A non-magnetic, electrically conductive spacer layer 18 is formed over the ferromagnetic storage layer 16. The non-magnetic, electrically conductive spacer layer 18, for example, may be copper and may be sputter deposited over the storage layer 16. Typically, for example, the non-magnetic, electrically conductive spacer layer 18 has a thickness of between 2 and 4 nm.

A sense layer 20 is formed over the non-magnetic, electrically conductive spacer layer 18. The sense layer 20, for example, may be a ferromagnetic alloy or multilayer such as NiFeCo, NiFe/CoFe, NiFe, or CoFe that is sputter deposited over the non-magnetic, electrically conductive spacer layer 18. The sense layer 20 is used to read data from the giant magnetoresistive memory device 10. Typically, the sense layer 20 has a thickness of between 1 nm and 10 nm.

As discussed above, the magnetization of the storage layer 16 may not always be uniform or aligned in the proper direction. This non-uniformity can reduce the repeatability of the switching that occurs during writing of information to the giant magnetoresistive memory cell 10 which, in turn, reduces the reliability of the giant magnetoresistive memory device 10.

Figure 2:
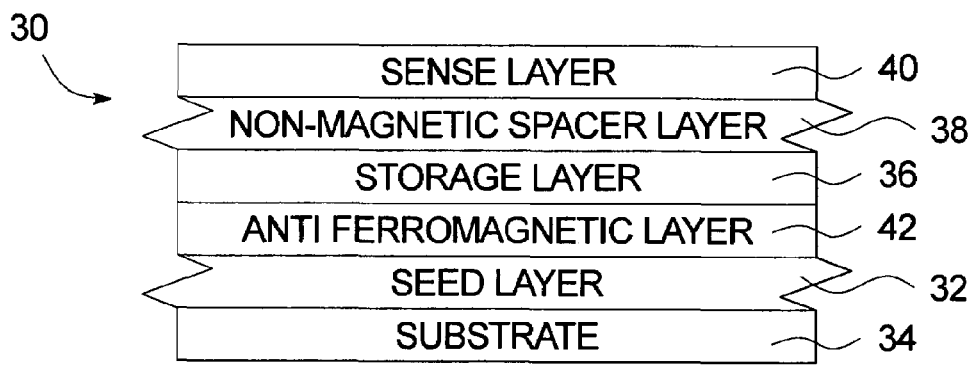
FIG. 2 illustrates the layers of a multilayer stack used for giant magnetoresistive memories according to one embodiment of the present invention.

The arrangement of FIG. 2 results in more uniformity and directionality of the magnetization in the storage layer 16.

As shown in FIG. 2, a giant magnetoresistive memory device 30 includes a seed layer 32 which may be formed such as by sputter deposition of silicon oxide(s), silicon nitride or tantalum on a substrate 34. The substrate 34, for example, may be silicon. The seed layer 32 is optional.

A storage layer 36 is formed over the seed layer 32. The storage layer 36, for example, may be a ferromagnetic alloy or multilayer such as NiFeCo, NiFe/CoFe, NiFe, or CoFe that is sputter deposited on the seed layer 32. The storage layer 36 is used to write data to the giant magnetoresistive memory device 30. The storage layer 36 may have a thickness, for example, of between 1 nm and 10 nm.

A non-magnetic, electrically conductive spacer layer 38 is formed over the storage layer 36. For example, the non-magnetic, electrically conductive spacer layer 38 may be copper and may be sputter deposited over the storage layer 36. The non-magnetic, electrically conductive spacer layer 38 may have a thickness, for example, of between 2 and 4 nm.

A sense layer 40 is formed over the non-magnetic, electrically conductive spacer layer 38. The sense layer 40, for example, may be a ferromagnetic alloy or multilayer such as NiFeCo, NiFe/CoFe, NiFe, or CoFe that is sputter deposited over the non-magnetic, electrically conductive spacer layer 38. The sense layer 40 is used to read data from the giant magnetoresistive memory device 30. The sense layer 40 may have a thickness, for example, of between 1 nm and 10 nm.

An antiferromagnetic layer 42 is formed over the seed layer so that the antiferromagnetic layer 42 is between the storage layer 36 and the seed layer 32. The antiferromagnetic layer 42, for example, may be FeMn, PtMn, NiMn, or CrPtMn that is sputter deposited over the seed layer 32 so that the antiferromagnetic layer 42 is between the storage layer 36 and the seed layer 32. The antiferromagnetic layer 46 may have a thickness, for example, of between 5 nm and 50 nm.

The antiferromagnetic layer 46 provides a controlled level of magnetic coupling to the storage layer 36. This controlled magnetic coupling tends to induce parallel and/or directional alignment of the magnetization in the storage layer 36 to improve switching characteristics and thereby improve the magnetic properties and reliability of the giant magnetoresistive memory device 30. However, the coupling should not be so strong as to significantly alter the switching fields of the giant magnetoresistive memory device 30.

If desired, a cap-layer, for example made of Ta, may be suitably formed over the sense layer 40.

Figure 3:
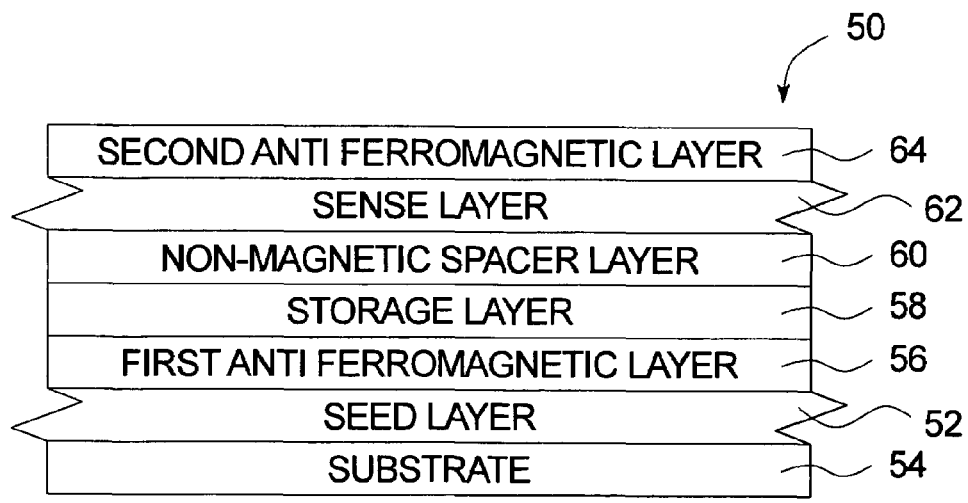
FIG. 3 illustrates the layers of a multilayer stack used for giant magnetoresistive memories according to another embodiment of the present invention; and, FIGS. 4–7 illustrate additional embodiments of the present invention.

The arrangement of FIG. 3 also results in more uniformity of the magnetization in the storage layer 16, and in more uniformity of the magnetization in the sense layer 20.

As shown in FIG. 3, a giant magnetoresistive memory device 50 includes a seed layer 52 which may be formed such as by sputter deposition of silicon oxide(s), silicon nitride or tantalum on a substrate 54. The substrate 54, for example, may be silicon. The seed layer 52 is optional.

A first antiferromagnetic layer 56 is formed on the seed layer 52. The first antiferromagnetic layer 56, for example, may be FeMn, PtMn, NiMn, or CrPtMn, that is sputter deposited over the seed layer 52. The first antiferromagnetic layer 56 may have a thickness, for example, of between 10 nm and 50 nm.

A storage layer 58 is formed over the first antiferromagnetic layer 56. The storage layer 58, for example, may be a ferromagnetic alloy or multilayer such as NiFeCo, NiFe/CoFe, NiFe, or CoFe that is sputter deposited over the first antiferromagnetic layer 56. The storage layer 58 is used to store (write) data to the giant magnetoresistive memory device 50. The storage layer 58 may have a thickness, for example, of between 1 nm and 10 nm.

A non-magnetic, electrically conductive spacer layer 60 is formed over the storage layer 58. For example, the non-magnetic, electrically conductive spacer layer 60 may be copper and may be sputter deposited over the storage layer 58. The non-magnetic, electrically conductive spacer layer 60 may have a thickness, for example, of between 2 nm and 4 nm.

A sense layer 62 is formed over the non-magnetic, electrically conductive spacer layer 60. The sense layer 62, for example, may be a ferromagnetic alloy or multilayer such as NiFeCo, NiFe/CoFe, NiFe, or CoFe that is sputter deposited over the non-magnetic, electrically conductive spacer layer 60. The sense layer 62 is used to read data from the giant magnetoresistive memory device 50. The sense layer 62 may have a thickness, for example, of between 1 nm and 10 nm.

A second antiferromagnetic layer 64 is formed over the sense layer 62. The second antiferromagnetic layer 64, for example, may be FeMn, PtMn, NiMn, or CrPtMn that is sputter deposited over the sense layer 62. The second antiferromagnetic layer 68 may have a thickness, for example, of between 10 nm and 50 nm.

The first antiferromagnetic layer 56 provides a controlled level of magnetic coupling to the storage layer 58. This controlled magnetic coupling tends to induce parallel and/or directional alignment of the magnetization in the storage layer 58 to improve magnetic characteristics and thereby improve the magnetic properties and reliability of the giant magnetoresistive memory device 50.

Similarly, the second antiferromagnetic layer 64 provides a controlled level of magnetic coupling to the sense layer 62. This controlled magnetic coupling tends to induce parallel and/or directional alignment of the magnetization in the sense layer 62 also to improve magnetic characteristics and thereby improve the magnetic properties and reliability of the giant magnetoresistive memory device 50. However, the couplings as described above should not be so strong as to significantly alter the switching fields of the giant magnetoresistive memory device 50.

If desired, a cap-layer, for example made of Ta, may be suitably formed over the second antiferromagnetic layer 64.

Certain modifications of the present invention will occur to those practicing in the art of the present invention. For example, the layers shown in FIGS. 2 and 3 may be extended and patterned to form MRAMs. Also, electronics may be formed in the substrate 54 to aid in the storing of information and the reading of that information.

Figure 4:
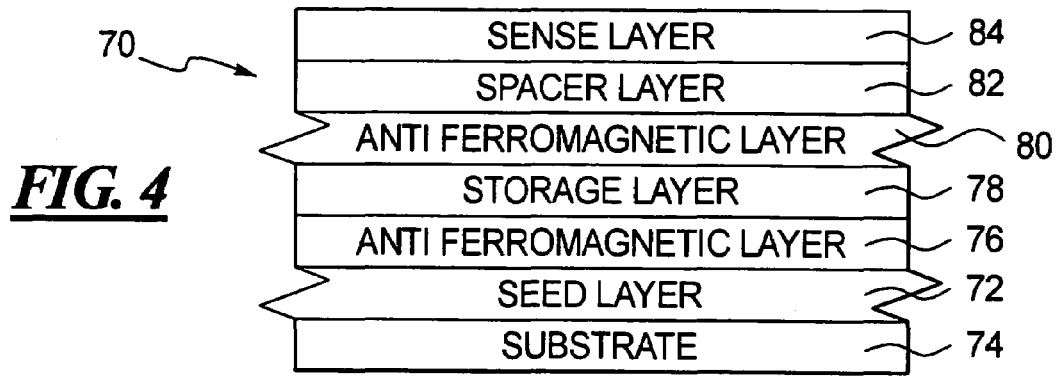

Additionally, the giant magnetoresistive memory device 30 is shown in FIG. 2 as having a single antiferromagnetic layer 42 formed between the storage layer 36 and the seed layer 32. Instead, two antiferromagnetic layers may be formed so that one antiferromagnetic layer is on each side of the storage layer 36. For example, as shown in FIG. 4, a giant magnetoresistive memory device 70 includes a seed layer 72 which may be formed on a substrate 74. An antiferromagnetic layer 76 is formed over the seed layer 72, a storage layer 78 is formed over the antiferromagnetic layer 76, an antiferromagnetic layer 80 is formed over the storage layer 78, a non-magnetic, electrically conductive spacer layer 82 is formed over the antiferromagnetic layer 80, and a sense layer 84 is formed over the non-magnetic, electrically conductive spacer layer 82. If desired, a cap-layer may be suitably formed over the sense layer 84.

Figure 5:
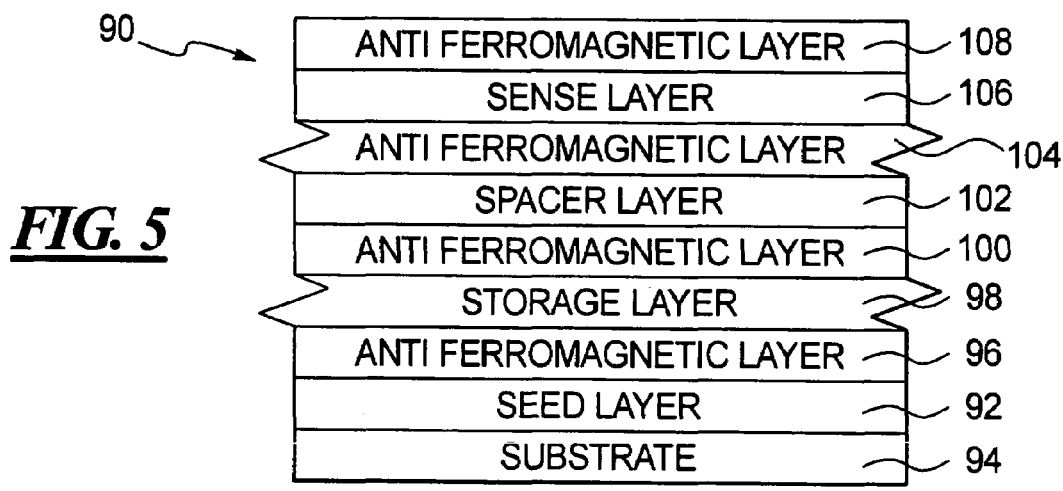

Similarly, the giant magnetoresistive memory device 50 is shown in FIG. 3 as having a single second antiferromagnetic layer 64 formed over the sense layer 62, and a single first antiferromagnetic layer 56 formed under the storage layer 58. Instead, two antiferromagnetic layers may be formed so that one antiferromagnetic layer is on each side of sense layer 62, and two antiferromagnetic layers may be formed so that one antiferromagnetic layer is on each side of storage layer 58. For example, as shown in FIG. 5, a giant magnetoresistive memory device 90 includes a seed layer 92 which may be formed on a substrate 94. An antiferromagnetic layer 96 is formed over the seed layer 92, a storage layer 98 is formed over the antiferromagnetic layer 96, an antiferromagnetic layer 100 is formed over the storage layer 98, a non-magnetic, electrically conductive spacer layer 102 is formed over the antiferromagnetic layer 100, an antiferromagnetic layer 104 is formed over the non-magnetic, electrically conductive spacer layer 102, a sense layer 106 is formed over the antiferromagnetic layer 104, and an antiferromagnetic layer 108 is formed over the sense layer 106. If desired, a cap-layer may be suitably formed over the antiferromagnetic layer 108.

Moreover, the antiferromagnetic layers are shown above as being formed over and/or under their corresponding ferromagnetic layers. However, the antiferromagnetic layers instead may be formed either under or over their corresponding ferromagnetic layers. It is also possible to form layers between the antiferromagnetic layers and their corresponding ferromagnetic layers as long as the controlled magnetic coupling described above is established to ensure substantially uniform and/or directional magnetization of the ferromagnetic layers.

Figure 6:
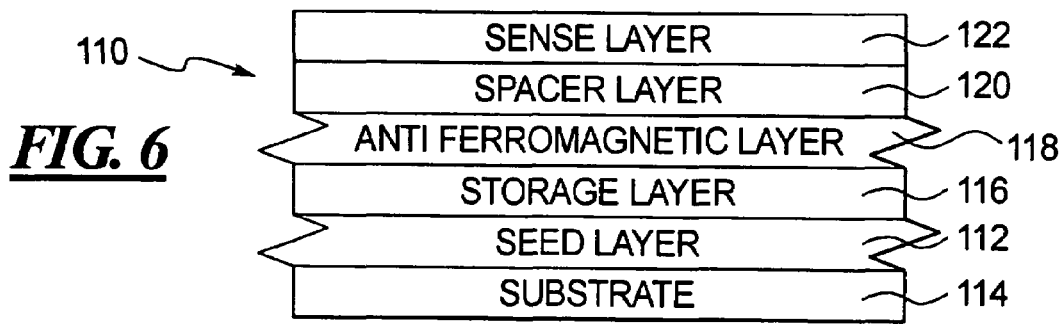

As an example, FIG. 6 shows a giant magnetoresistive memory device 110 that includes a seed layer 112 which may be formed on a substrate 114. A storage layer 116 is formed over the seed layer 112, an antiferromagnetic layer 118 is formed over the storage layer 116, a non-magnetic, electrically conductive spacer layer 120 is formed over the antiferromagnetic layer 118, and a sense layer 122 is formed over the non-magnetic, electrically conductive spacer layer 120. If desired, a cap-layer may be suitably formed over the sense layer 122.

Figure 7:
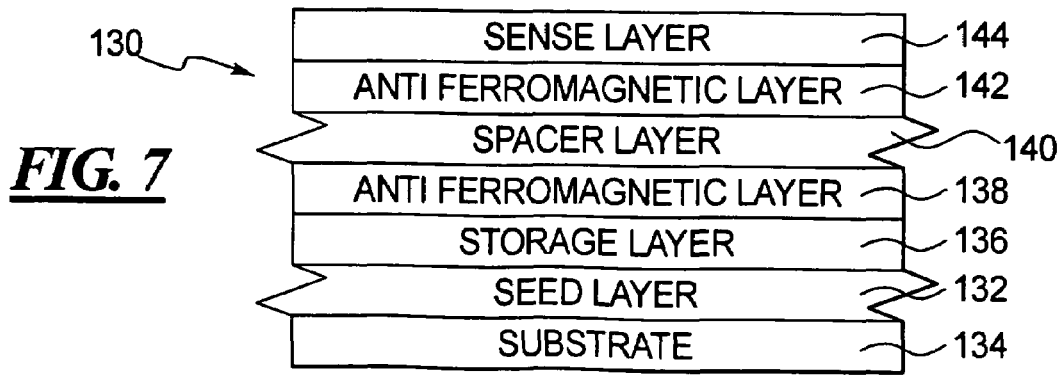

As another example, FIG. 7 shows a giant magnetoresistive memory device 130 that includes a seed layer 132 formed on a substrate 134. A storage layer 136 is formed over the seed layer 132, an antiferromagnetic layer 138 is formed over the storage layer 136, a non-magnetic, electrically conductive spacer layer 140 is formed over the antiferromagnetic layer 138, an antiferromagnetic layer 142 is formed over the non-magnetic, electrically conductive spacer layer 140, and a sense layer 144 is formed over the antiferromagnetic layer 142. If desired, a cap-layer may be suitably formed over the sense layer 144.

It should be noted that, when two antiferromagnetic layers are used per storage and/or sense layer, the antiferromagnetic layer near the non-magnetic spacer layer may be the thinner of the two antiferromagnetic layers. However, this thinner antiferromagnetic layer should be thick enough to impart magnetization uniformity and directionality, but not so thick as to disrupt magnetoresistive properties.

Further, the strength of the antiferromagnetic coupling to a storage layer may be different than that of the antiferromagnetic coupling to a sense layer. First, this difference in coupling can be used to optimize performance. Second, when the antiferromagnetic coupling to the sense layer is substantial, the strongly coupled antiferromagnetic layer can be used to fix or pin the magnetization of the sense layer. The coupling of the antiferromagnetic layer that is adjacent to the storage layer can be adjusted, for example by choice of material or processing, to control uniformity and/or directionality of the magnetization in the storage layer without necessarily significantly altering the switching fields of the storage layer.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

I claim:

1. A giant magnetoresistive memory device comprising:
   a magnetic storage layer;
   a magnetic sense layer;
   a non-magnetic spacer layer between the magnetic sense layer and the magnetic storage layer; and,
   an antiferromagnetic layer formed in proximity to the magnetic storage layer whereby the antiferromagnetic layer couples magnetically in a controlled manner to the magnetic storage layer such that the magnetic storage layer has uniform and/or directional magnetization.

2. The giant magnetoresistive memory device of claim 1 wherein the magnetic storage layer comprises a ferromagnetic alloy.

3. The giant magnetoresistive memory device of claim 1 wherein the magnetic storage layer comprises ferromagnetic multilayers.

4. The giant magnetoresistive memory device of claim 1 wherein the storage layer is between the non-magnetic spacer layer and the antiferromagnetic layer, and wherein the non-magnetic spacer layer is between the storage layer and the sense layer.

5. The giant magnetoresistive memory device of claim 4 wherein the magnetic storage layer comprises a ferromagnetic alloy.

6. The giant magnetoresistive memory device of claim 4 wherein the magnetic storage layer comprises ferromagnetic multilayers.

7. The giant magnetoresistive memory device of claim 1 wherein the antiferromagnetic layer is between the non-magnetic spacer layer and the storage layer, and wherein the non-magnetic spacer layer is between the antiferromagnetic layer and the sense layer.

8. The giant magnetoresistive memory device of claim 7 wherein the magnetic storage layer comprises a ferromagnetic alloy.

9. The giant magnetoresistive memory device of claim 7 wherein the magnetic storage layer comprises ferromagnetic multilayers.

10. The giant magnetoresistive memory device of claim 1 wherein the antiferromagnetic layer comprises a first antiferromagnetic layer, wherein the giant magnetoresistive memory device comprises a second antiferromagnetic layer, wherein the storage layer is between the first and second antiferromagnetic layers, wherein the second antiferromagnetic layer is between the non-magnetic spacer layer and the storage layer, and wherein the non-magnetic spacer layer is between the second antiferromagnetic layer and the sense layer.

11. The giant magnetoresistive memory device of claim 10 wherein the magnetic storage layer comprises a ferromagnetic alloy.

12. The giant magnetoresistive memory device of claim 10 wherein the magnetic storage layer comprises ferromagnetic multilayers.

13. A giant magnetoresistive memory device comprising:
a magnetic storage layer;
a magnetic sense layer;
a non-magnetic spacer layer between the magnetic sense layer and the magnetic storage layer;
a first antiferromagnetic layer formed in proximity to the magnetic storage layer whereby the first antiferromagnetic layer couples magnetically in a controlled manner to the magnetic storage layer such that the magnetic storage layer has uniform and/or directional magnetization; and,
a second antiferromagnetic layer formed in proximity to the magnetic sense layer whereby the second antiferromagnetic layer couples magnetically in a controlled manner to the magnetic sense layer such that the magnetic sense layer has uniform and/or directional magnetization.

14. The giant magnetoresistive memory device of claim 13 wherein the magnetic storage layer comprises a ferromagnetic alloy.

15. The giant magnetoresistive memory device of claim 13 wherein the magnetic storage layer comprises ferromagnetic multilayers.

16. The giant magnetoresistive memory device of claim 13 wherein the magnetic sense layer comprises a ferromagnetic alloy.

17. The giant magnetoresistive memory device of claim 13 wherein the magnetic sense layer comprises ferromagnetic multilayers.

18. The giant magnetoresistive memory device of claim 13 wherein the magnetic sense layer comprises a first ferromagnetic alloy, and wherein the magnetic storage layer comprises a second ferromagnetic alloy.

19. The giant magnetoresistive memory device of claim 13 wherein the magnetic sense layer comprises first ferromagnetic multilayers, and wherein the magnetic storage layer comprises second ferromagnetic multilayers.

20. The giant magnetoresistive memory device of claim 13 wherein the storage layer is between the non-magnetic spacer layer and the first antiferromagnetic layer, and wherein the sense layer is between the non-magnetic spacer layer and the second antiferromagnetic layer.

21. The giant magnetoresistive memory device of claim 13 wherein the storage layer is between the non-magnetic spacer layer and the first antiferromagnetic layer, and wherein the second antiferromagnetic layer is between the sense layer and the non-magnetic spacer layer.

22. The giant magnetoresistive memory device of claim 13 wherein the first antiferromagnetic layer is between the storage layer and the non-magnetic spacer layer, and wherein the sense layer is between the second antiferromagnetic layer and the non-magnetic spacer layer.

23. The giant magnetoresistive memory device of claim 13 wherein the first antiferromagnetic layer is between the storage layer and the non-magnetic spacer layer, and wherein the second antiferromagnetic layer is between the sense layer and the non-magnetic spacer layer.

24. The giant magnetoresistive memory device of claim 13 wherein the first antiferromagnetic layer comprises first and second storage antiferromagnetic layers, wherein the second antiferromagnetic layer comprises first and second sense antiferromagnetic layers, wherein the storage layer is between the first and second storage antiferromagnetic layers, wherein the second storage antiferromagnetic layer is between the storage layer and the non-magnetic spacer layer, wherein the sense layer is between the first and second sense antiferromagnetic layers, and wherein the second sense antiferromagnetic layer is between the sense layer and the non-magnetic spacer layer.

25. The giant magnetoresistive memory device of claim 24 wherein the second storage antiferromagnetic layer is thinner that the first storage antiferromagnetic layer.

26. The giant magnetoresistive memory device of claim 24 wherein the second sense antiferromagnetic layer is thinner that the first sense antiferromagnetic layer.

27. The giant magnetoresistive memory device of claim 26 wherein the second storage antiferromagnetic layer is thinner that the first storage antiferromagnetic layer.

* * * * *

UNITED STATES PATENT AND TRADEMARK OFFICE
CERTIFICATE OF CORRECTION

PATENT NO. : 7,053,430 B2 Page 1 of 1
APPLICATION NO. : 10/706068
DATED : May 30, 2006
INVENTOR(S) : Romney R. Katti It is certified that error appears in the above-identified patent and that said Letters Patent is hereby corrected as shown below:

Column 8, Line 39, please delete "that" and substitute --than--.

Column 8, Line 42, please delete "that" and substitute --than--.

Column 8, Line 45, please delete "that" and substitute --than--.

Signed and Sealed this

Sixth Day of March, 2007

JON W. DUDAS
*Director of the United States Patent and Trademark Office*